United States Patent [19]

Kodaira

[11] 4,034,303
[45] July 5, 1977

[54] ELECTRONIC PULSE GENERATING CIRCUIT FOR ELIMINATING SPIKE PULSES

[75] Inventor: Mitsuharu Kodaira, Suwa, Japan

[73] Assignee: Kabushiki Kaisha Suwa Seikosha, Tokyo, Japan

[22] Filed: Nov. 26, 1975

[21] Appl. No.: 635,473

[30] Foreign Application Priority Data
Nov. 27, 1974 Japan .............................. 49-136455

[52] U.S. Cl. .................................. 328/62; 307/208; 307/225 R; 307/247 R; 328/39; 328/63
[51] Int. Cl.² ...................... H03K 3/04; H03K 1/17
[58] Field of Search ........... 307/208, 220 R, 225 R, 307/247 R, 289, 291, 221 D, 220 C, 225 C; 328/39, 62, 195, 55, 63

[56] References Cited
UNITED STATES PATENTS

| 2,892,934 | 6/1959 | Lubkin | 328/39 |
| 3,439,278 | 4/1969 | Farrow | 307/225 R |
| 3,551,822 | 12/1970 | McNelis | 307/208 |
| 3,612,906 | 10/1971 | Kennedy | 307/247 R |
| 3,728,560 | 4/1973 | Treadway | 307/225 R |
| 3,728,561 | 4/1973 | Brocker, Jr. | 307/225 R |
| 3,851,258 | 11/1974 | Freedman | 328/39 |
| 3,955,100 | 5/1976 | Takahashi et al. | 307/208 |
| 3,959,730 | 5/1976 | Weber et al. | 307/208 |

Primary Examiner—Stanley D. Miller, Jr.
Attorney, Agent, or Firm—Blum, Moscovitz, Friedman & Kaplan

[57] ABSTRACT

An electronic pulse generating circuit adapted to receive a time standard clock signal having a predetermined frequency and pulse width and generate, in response thereto, a timing signal having the same pulse width as the time standard signal and a lower frequency than the time standard signal, is provided. The pulse generating circuit is characterized by a divider stage adapted to receive the time standard signal and in response thereto produce a first output signal having half the frequency of the time standard frequency signal, and a second output signal having the same frequency as the first output signal but time delayed by a period equal to the predetermined pulse width of the time standard signal. A logic circuit is adapted to receive as first and second inputs the first and second output signals and in response to detecting coincident binary states thereof, produce a timing signal having the same pulse width as the predetermined pulse width of the time standard signal and a frequency less than or equal to one-half the predetermined frequency of the time standard signal.

6 Claims, 7 Drawing Figures

ELECTRONIC PULSE GENERATING CIRCUIT FOR ELIMINATING SPIKE PULSES

BACKGROUND OF THE INVENTION

This invention is directed to an electronic pulse generating circuit, and in particular to an electronic pulse generating circuit for producing timing signals to be applied to an electronic utilization device, which signals have a predetermined pulse width and are absent spike pulses that could be detected by a utilization device.

While counters and other pulse generating circuits for applying a diminished frequency predetermined pulse width signals to an electronic utilization device, in response to a higher frequency time standard clock signal having a predetermined pulse width being applied thereto, have taken on various forms, such circuits produce extraneous spike pulses of sufficient pulse width to be inadvertently detected by an electronic utilization device. Specifically, such pulse generating circuits are comprised of a flip-flop. The output timing signals produced by the flip-flop are compared with the time standard clock signal applied to the flip-flop to generate the output timing signals. However, the respective leading and falling edges of the timing signals produced by a delay flip-flop are delayed with respect to the leading and falling edges of the time standard input signal due in large measure to the switching response of the transistors comprising the delay flip-flop. Accordingly, the asynchronous occurrences of the respective leading and falling edges of the timing signals produced by the delay flip-flop and the time standard clock signal result in unwanted spike pulses having pulse widths equal to the asynchronous delay between signals being produced.

SUMMARY OF THE INVENTION

Generally speaking, in accordance with the instant invention, an electronic pulse generating circuit for producing timing signals of a predetermined pulse width and diminished frequency is provided. The pulse generating circuit includes a first divider stage adapted to receive a time standard signal having a predetermined frequency and predetermined pulse width and in response thereto produce a first output signal having a frequency equal to one-half the predetermined frequency of the time standard frequency signal, the divider stage being further adapted to produce a second output signal having the same frequency as the first output signal and time delayed with respect thereto by a period of time equal to the duration of the predetermined pulse width. A logic circuit element is coupled to receive the first and second output signals produced by the divider stage, and in response to a coincident binary state condition of the respective output signals, produce a timing signal having a pulse width equal to the predetermined pulse width of the time standard signal and a frequency equal to one-half the predetermined frequency of the time standard signal.

Accordingly, it is an object of this invention to provide an improved electronic pulse generating circuit for producing timing signals absent unwanted spike signals.

A further object of the instant invention is to provide an improved pulse generating circuit wherein spike pulses caused by the switching response of the transistors forming the pulse generating circuitry are eliminated.

Still a further object of the instant invention is to find an improved pulse generating circuit for applying timing signals of a predetermined pulse width for detection by a utilization device, notwithstanding the reduced frequency of the timing signal.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENT

Figure 1:
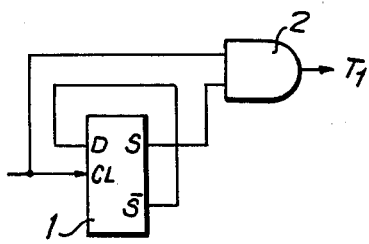
FIG. 1 is a block circuit diagram of a pulse generating circuit constructed in accordance with the prior art.
Figure 2:
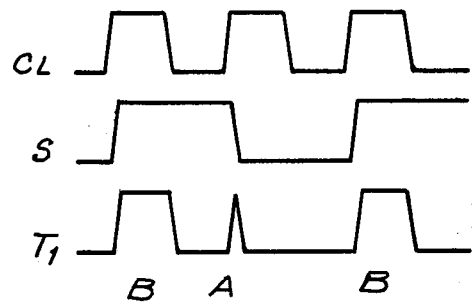
FIG. 2 is a wave diagram illustrating the operation of the pulse generating circuit depicted in FIG. 1.

Reference is now made to FIGS. 1 and 2, wherein a pulse generating circuit and wave diagrams therefor, constructed in accordance with the prior art, are respectively depicted. In response to a time standard clock signal CL being applied to a slave delay flip-flop 1 of a binary divider circuit, an output signal is produced at the S terminal of the delay flip-flop having a frequency equal to one-half that of the time standard clock signal CL applied thereto. Due to the switching response of the transistors comprising the flip-flop 1, the leading edges of the output signal S are slightly delayed with respect to the leading edges of the time standard clock signal CL. The output signal S and the time standard clock signal CL are respectively applied to AND gate 2, which AND gate in response to detecting a coincident 1 binary state of both signals applied thereto, produces a timing signal $T_1$. The delay between the leading and falling edges of the output signal S and time standard signal CL causes a spike pulse A to be inadvertently generated. Accordingly, if the timing signal is being applied to a utilization device having, for example, a transistor detection circuit as the first stage thereof, the transistor at the next stage would detect the spike pulse A in the same manner that the pulses B would be detected, and would cause the utilization device to be inadvertently operated thereby.

Accordingly, when a utilization device includes a transistor as a first detecting stage, it is necessary to couple a capacitive load to the output of the pulse generating circuit to reduce the peak voltage of the spike pulses below the threshhold value of the transistors defining the input stage of the utilization device in order to avoid such transistors detecting the spike pulse. Nevertheless, the use of capacitive loads at the output of the pulse generating circuit provides less stable operation thereof, and an attendant reduction in the switching characteristics of the transistors comprising the pulse generating circuit and hence a likewise degradation in the timing signal pulses B applied to the detecting stages of the utilization device.

Figure 3:
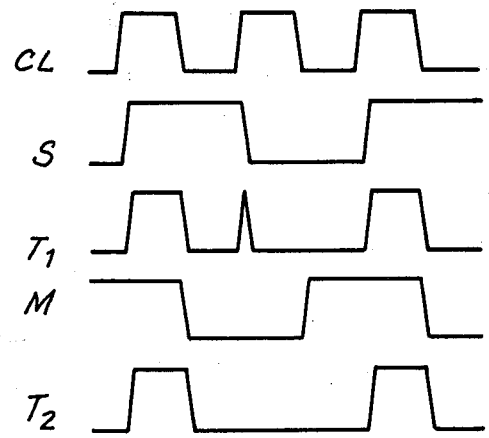
FIG. 3 is a wave diagram illustrating the operation of a pulse generating circuit constructed in accordance with the instant invention.

Reference is now made to the wave diagram illustrated in FIG. 3 for an illustration of the manner in which the instant invention eliminates the generation of spike pulses in the timing signal. As in the prior art embodiment illustrated in FIG. 1, a binary divider circuit utilizing delay flip-flops is provided. However, in addition to the slave flip-flop, the binary divider stage includes a master flip-flop and the M output thereof is utilized in combination with the slave output S, and the respective complements of the master and the slave signals, $\overline{M}$ and $\overline{S}$, to produce a timing signal having a pulse width equal to the predetermined pulse width of the time standard clock signal but of a lesser frequency, the spike pulses being eliminated from the timing signal thereby. Specifically, by applying the output signal S of the slave flip-flop and the output signal M of the master flip-flop to an output AND gate, a timing signal $T_2$, not having any spike pulses, but having been divided to a reduced frequency by the divider stage, and having a pulse width equal to the pulse width of the time standard clock signal is produced. Accordingly, by using logic circuitry, a timing signal is produced without spike pulses and without causing the attendant degradation in switching characteristics caused by utilizing a capacitive load to avoid inadvertent detection of the spike pulses by a utilization device.

Figure 4:
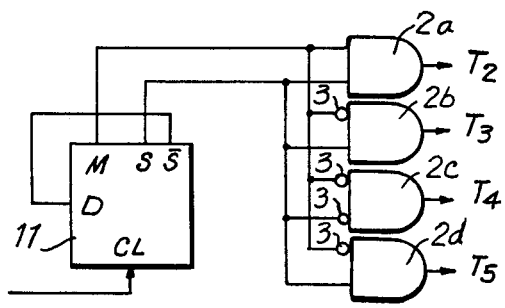
FIG. 4 is a pulse generating circuit constructed in accordance with a preferred embodiment of the instant invention.
Figure 5:
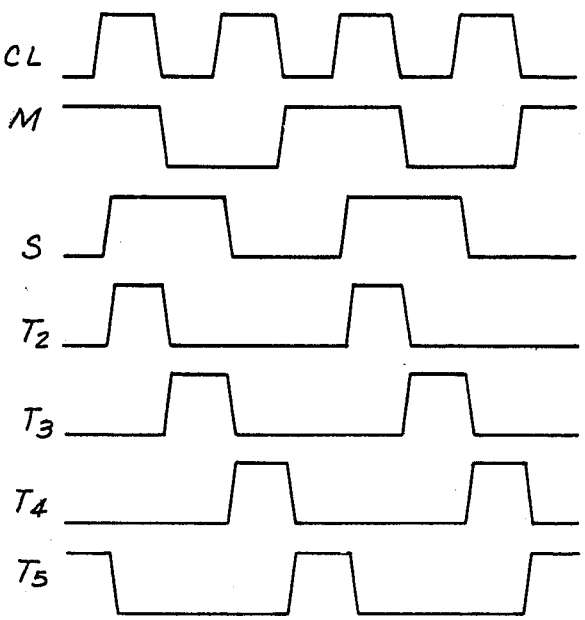
FIG. 5 is a wave diagram illustrating the operation of the pulse generating circuit depicted in FIG. 4.

The pulse generator circuit for producing the master and slave output signals, and the timing signal $T_2$ illustrated in FIG. 3, is illustrated in FIG. 4 and is comprised of a divider stage 11 and AND gate $2_a$. As is specifically illustrated in FIG. 3, by designating each 1 binary state output signal as a "true" output signal and the opposite 0 binary state signal as a "false" output signal, the respective master and slave output signals of the delay flip-flops comprising the divider stage can be selectively applied to appropriate gating circuitry (AND gates, OR gates, etc.) to effectively combine same to produce a timing signal of a reduced frequency having a pulse width equal to the pulse width of the time standard clock signal applied to the pulse generating circuit.

Referring specifically to FIG. 4, binary divider stage 11 respectively produces master binary flip-flop output signal M and slave binary flip-flop output signal S and applies a combination of the respective master and slave flip-flop signals to AND gates $2_a$, $2_b$, $2_c$ and $2_d$, respectively, to produce timing signals $T_2$, $T_3$, $T_4$ and $T_5$, respectively, each of the timing signals having a frequency of one-half that of the time standard clock signal and a pulse width equal to the time standard clock signal.

It is further noted that inverter circuits 3 are disposed intermediate the respective master and slave output terminals M and S of the binary divider stage 11 and selected input terminals of AND gates $2_b$, $2_c$ and $2_d$. Alternatively, the complement signal produced at the $\overline{M}$ and $\overline{S}$ terminals can be applied to the respective AND gate input terminals having inverters 3, thereby eliminating the necessity for such inverter circuits.

Figure 6:
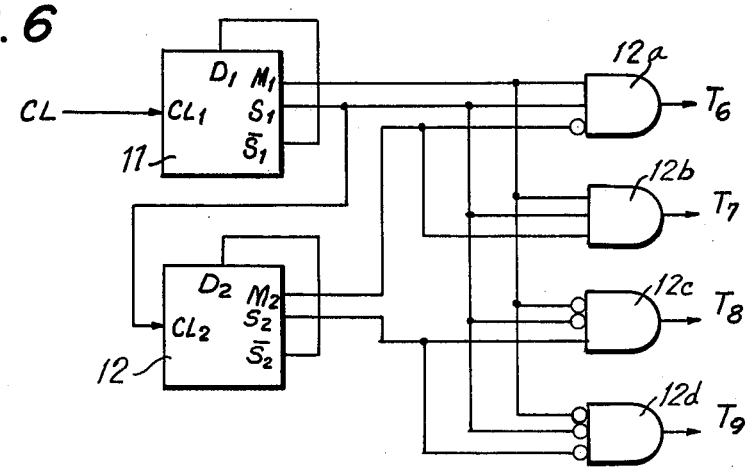
FIG. 6 is a block circuit diagram of a pulse generating circuit constructed in accordance with a preferred embodiment of the instand invention.
Figure 7:
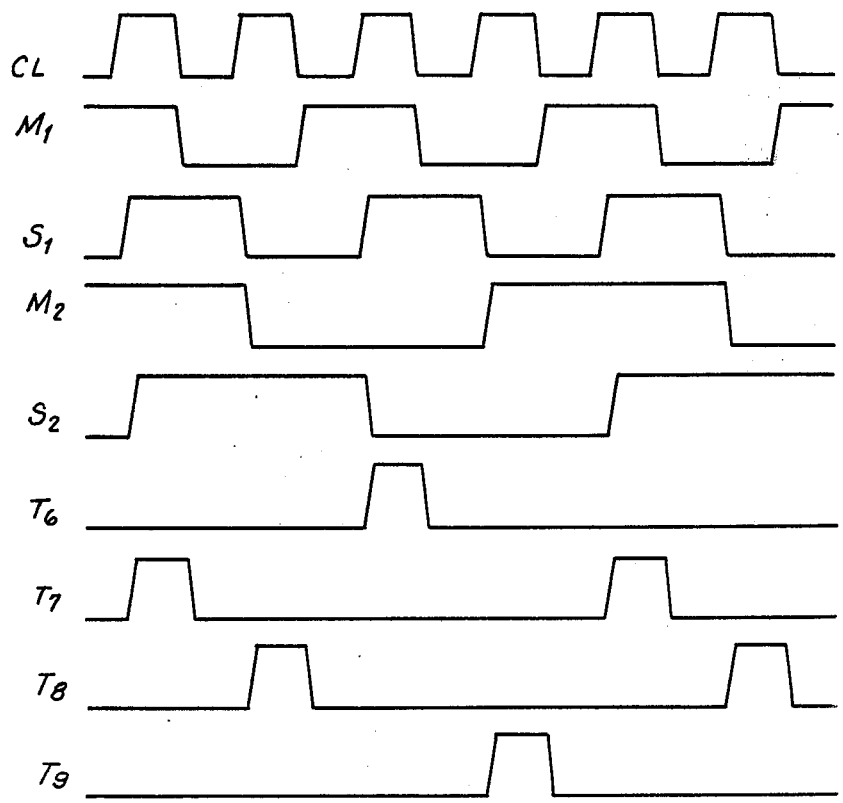
FIG. 7 is a wave diagram illustrating the operation of the pulse generating circuit depicted in FIG. 6.

Reference is now made to FIGS. 6 and 7 wherein an electronic pulse generating circuit constructed in accordance with a further embodiment of the instant invention is depicted. The pulse generating circuit is comprised of two series-connected divider stages 11 and 12, like reference numerals being utilized to denote like elements illustrated above. Accordingly, the slave flip-flop output terminal $S_1$ of binary divider stage 11 is coupled to the clock terminal $CL_2$ of the second binary divider stage 12 to thereby produce output signals at the master and slave terminals $M_2$ and $S_2$ of the divider stage 12 having one-fourth the frequency of the time standard clock signal CL applied to the input terminal $CL_1$ of binary divider stage 11. The respective output signals produced at the master and slave output terminals $M_1$ and $S_1$ of binary divider stage 11, and the respective output signals produced at master and slave terminals, $M_2$ and $S_2$, of binary divider stage 12 are selectively applied to the respective input terminals of AND gates $12_a$, $12_b$, $12_c$ and $12_d$, to produce timing signals $T_6$, $T_7$, $T_8$ and $T_9$. Each of the timing signals produced by the pulse generating circuit illustrated in FIG. 6 have a frequency equal to one-quarter that of the time standard clock signal CL applied to the clock terminal $CL_1$ of divider stage 11 and the same pulse width as the time standard clock signal CL. It is noted that each of the AND gates has the master and slave output signals $M_1$ and $S_1$ of divider stage 11, or the complements thereof, respectively applied to two of the three input terminals of each AND gate. The third input to each AND gate is either the master or slave output signals $M_2$ and $S_2$ of the second series-connected divider stage 12, or the complement thereof. Accordingly, the master and slave output signals from the first divider stage 11 are utilized to form the timing signal with a pulse width equal to the pulse width of the time standard clock signal CL, and the respective master and slave output signals of the second divider stage 12 are applied to each AND gate to effect gating of the predetermined pulse width timing signal once during each four cycles of the time standard clock signal, and hence provide a timing signal having a frequency of one-fourth the frequency of the time standard clock signal and a pulse width equal to the pulse width of the time standard clock signal.

It is further noted that although the binary divider stages utilized to produce the signals illustrated in FIG. 7 are comprised of delay flip-flops, the instant invention is not limited thereto. For example, the pulse generating circuit can be formed to produce timing signals without spike pulses by providing a counter circuit for counting the time standard clock signals applied thereto and applying the counted signals to a delay flip-flop. The delayed output signals produced by the master and slave flip-flops can then be selectively combined by the delay flip-flop to produce a timing signal having a predetermined pulse width.

It is noted that the instant invention is particularly suitable for use in generating timing signals for application to electronic utilizations circuits having an input detection stage comprised of C-MOS field effect transistors, such C-MOS transistor detection circuits being particularly sensitive to spike pulses in light of the very high response speeds at which same are switched.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An electronic pulse generating circuit comprising in combination divider stage means for receiving a time standard signal having a predetermined frequency and pulse width, said divider stage means including a first divider stage having master and slave flip-flops, said master flip-flop producing a first output signal having a frequency less than or equal to one-half said predetermined frequency of said time standard frequency signal in response to said time standard signal being applied thereto, said slave flip-flop being coupled to said master flip-flop for producing a second output signal having the same frequency as said first output signal in response to said time standard signal being applied thereto, said second output signal being time delayed with respect to said first output signal by a time interval equal to the time interval of the predetermined pulse width of the time standard clock signal, and logic means for receiving said first and second output signals and in response to detecting coincident predetermined states thereof, producing a timing pulse signal having a frequency less than or equal to one-half the predetermined frequency of the time standard signal and having a pulse width equal to the pulse width of said time standard signal.

2. An electronic pulse generating circuit as claimed in claim 1, wherein the frequency of said first and second output signals produced by said divider stage means equal one-half said predetermined frequency of said time standard signal and said timing pulse signal produced by said logic means has a frequency equal to one-half the predetermined frequency of said time standard signal.

3. An electronic pulse generating circuit as claimed in claim 1, wherein said logic means is an AND gate.

4. An electronic pulse generating circuit as claimed in claim 1, wherein said divider stage means also includes a second divider stage coupled to said first divider stage, said first divider stage producing said first and second output signals, said output signals having a frequency equal to one-half said predetermined frequency of said time standard signal, said second divider stage receiving said first output signal produced by said first divider stage and in response thereto producing a third output signal equal to one-half the frequency of said first output signal, said logic means in addition to receiving said first and second output signals further receiving said third output signal, and in response to detecting coincident predetermined states of the respective output signals applied thereto, producing a timing pulse signal having a frequency equal to one-fourth the predetermined frequency of the time standard signal and a pulse width equal to the pulse width of said time standard signal.

5. An electronic pulse generating circuit as claimed in claim 4, wherein said second divider stages includes master-slave delay flip-flops, one of said second divider stage master flip-flop and slave flip-flop producing said third output signal.

6. An electronic pulse generating circuit as claimed in claim 5, wherein said logic means is an AND gate.

* * * * *